(12) United States Patent
Chen et al.

(10) Patent No.: US 6,751,769 B2
(45) Date of Patent: Jun. 15, 2004

(54) (146,130) ERROR CORRECTION CODE UTILIZING ADDRESS INFORMATION

(75) Inventors: Chin-Long Chen, Fishkill, NY (US); R. Brett Tremaine, Stormville, NY (US); Michael E. Wazlowski, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/349,992

(22) Filed: Jan. 23, 2003

(65) Prior Publication Data

US 2003/0140300 A1 Jul. 24, 2003

Related U.S. Application Data

(62) Division of application No. 09/588,748, filed on Jun. 6, 2000.

(51) Int. Cl.[7] ............................................. G11C 29/00
(52) U.S. Cl. ...................................... 714/767; 714/773
(58) Field of Search ................................. 714/767, 773

(56) References Cited

U.S. PATENT DOCUMENTS

| | | | |
|---|---|---|---|
| 4,464,753 A | 8/1984 | Chen | |
| 4,661,955 A | 4/1987 | Arlington et al. | |
| 4,862,463 A | 8/1989 | Chen | |
| 5,450,422 A | 9/1995 | Dell | |
| 5,450,423 A | 9/1995 | Iwasaki et al. | |
| 5,481,552 A | 1/1996 | Aldereguia et al. | |
| 5,490,155 A | 2/1996 | Abdoo et al. | |
| 5,563,894 A | 10/1996 | Fujiwara et al. | |
| 5,691,996 A | * 11/1997 | Chen et al. | ................... 714/805 |
| 5,734,664 A | 3/1998 | Saxena | |
| 5,757,823 A | 5/1998 | Chen et al. | |
| 5,761,221 A | * 6/1998 | Baat et al. | ................... 714/767 |
| 5,768,294 A | * 6/1998 | Chen et al. | ................... 714/766 |
| 5,781,568 A | 7/1998 | Hsieh | |
| 5,841,795 A | 11/1998 | Olarig et al. | |
| 5,878,059 A | 3/1999 | Maclellan | |
| 5,978,953 A | * 11/1999 | Olarig | ........................ 714/768 |
| 6,003,152 A | 12/1999 | Singhal | |
| 6,009,548 A | 12/1999 | Chen et al. | |
| 6,457,154 B1 | * 9/2002 | Chen et al. | ................... 714/768 |

* cited by examiner

*Primary Examiner*—Albert Decady
*Assistant Examiner*—Joseph D. Torres
(74) *Attorney, Agent, or Firm*—Scully, Scott, Murphy & Presser; Derek S. Jennings

(57) ABSTRACT

A method of detecting double-symbol errors and correcting single-symbol errors in a data stream being transmitted in a computer system, e.g., from a memory array to a memory controller. The method includes decoding the data stream which was encoded using a logic circuit which had, as inputs, the data being sent and two address parity bits derived from the system address of the data. Data retrieved from the wrong address can be detected by this code. The logic circuit is described by a parity-check matrix for this (146,130) code comprising 128 data bits, 16 check bits, and 2 address parity bits. Although the symbol width of the code is four bits, the code can also be used effectively in memory systems where the memory chip width is eight bits.

3 Claims, 5 Drawing Sheets

(146,130) ERROR CORRECTION CODE UTILIZING ADDRESS INFORMATION

RELATED APPLICATIONS

This application is a divisional of U.S. application Ser. No. 09/588,748, filed Jun. 6, 2000.

BACKGROUND OF THE INVENTION

1. Field of the Invention

This invention relates in general to the field of computer systems and, in particular, to error detection and correction of transmitted data to and from a memory controller.

2. Discussion of the Prior Art

Computer systems generally consist of one or more processors that execute program instructions stored within a memory medium. This mass storage medium is most often constructed of the lowest cost per bit, yet slowest storage technology, typically magnetic or optical media. To increase the system performance, a higher speed, yet smaller and more costly memory, known as the main memory, is first loaded with information from the mass storage for more efficient direct access by the processors. Program instructions are read from main memory and program data may be read or written. Error detecting and correcting codes can be used to detect errors in the information as it is read from main memory and to correct the errors, if possible.

Parity checks and error correction codes (ECCs) are commonly used to ensure that data is properly transferred between system components. For example, a magnetic disk (non-volatile memory device) typically records not only information that comprises data to be retrieved for processing, but also records an error correction code for each file, which allows the processor, or a controller, to determine whether the data retrieved is valid. ECCs are also used with volatile memory devices, such as DRAM, and the ECC for data stored in DRAM can be analyzed by a memory controller which provides an interface between the processor and the DRAM array. If a memory cell fails during the reading of a particular memory word, due to some external force or internal deficiency, then the failure can at least be detected. ECCs can further be used to reconstruct the proper data stream.

Some error correction codes can only be used to detect single-bit errors; if two or more bits in a particular memory word are invalid, then the ECC might not be able to determine what the proper data stream should actually be. Other ECCs are more sophisticated and allow detection or correction of double errors, and some ECCs further allow the memory word to be divided into clusters of bits, or symbols, which can then be analyzed for errors in more detail, such as the ECC in commonly-owned U.S. Pat. No. 5,757,823, incorporated by reference herein. ECCs commonly use parity-check matrices to define the mathematical formula for deriving the check bits from the data bits.

For a memory array having a "b-bit-per-chip" configuration, the proper ECC is one that is capable of correcting all single symbol errors and detecting all double-symbol errors, where a symbol error is any one of the $2^b-1$ error patterns generated from a failure of an array chip. Using this single-symbol-correction double-symbol-detection, the memory may continue to function as long as there is no more than one chip failure in the group of array chips covered by the same ECC word. All errors generated from a single chip failure are automatically corrected by the ECC regardless of the failure mode of the chip. Sometime later, when a second chip in the same chip group fails, double-symbol errors may be present. These double-symbol errors would be detected by the ECC. To prevent data loss in this case, a proper maintenance strategy is executed to ensure the number of symbol errors does not accumulate beyond one.

In addition to data errors in computer systems, a separate class of errors based on failures in memory addressing also exist. Memory addressing errors can be caused by the same types of phenomenon that cause data errors internally in a memory chip. For example, these failures can cause data that was intended to be written to address location 0 to be written to address location 10 instead, resulting in the corruption of the proper data that was contained at address 10. A (78,66) ECC which corrects single-symbol errors and detects any combination of a single-symbol error and a single-bit error from a second symbol, as well as detects address errors, is discussed in U.S. Pat. No. 5,768,294.

It would be highly desirable to provide a single-symbol correcting double-symbol detecting ECC system which detects address errors and additionally provides the ability to detect all combinations of bit errors in the second error symbol above and beyond the capability presented in above-referenced U.S. 5,768,294.

It would further be desirable to provide a (146,130) single-symbol correcting double-symbol detecting ECC which detects address errors.

It would additionally be desirable to provide a (146,130) single-symbol correcting double-symbol detecting ECC having capability for detecting address errors that can be implemented using industry standard DIMMs, and, advantageously, be implemented in such a way to achieve the more desirable 8-bit symbol width even though the ECC code is designed for 4-bit symbols.

SUMMARY OF THE INVENTION

It is an object of the present invention to provide a (146,130) single-symbol correcting double-symbol detecting ECC which detects address errors and provides the ability to detect all combinations of bit errors in a second error symbol.

It is a further object of the present invention to, provide a (146,130) single-symbol correcting double-symbol detecting ECC designed to detect 4 bit symbols, and which may be implemented in such a way to correct an 8-bit symbol width.

In accordance with a preferred embodiment of the present invention, digital signal encoding and decoding is accomplished through the utilization of a parity check matrix and two parity bits generated from the system address bits of a computing system with thirty-six (36) symbols and four (4) bits per symbol. The method of encoding data symbols which are four bits in length comprises generating first the address parity bits from the system address bits. The two address parity bits are then used in conjunction with the data bits to generate sixteen check bits. The data bits and check bits are then stored in the memory array of the computer.

A similar, but reverse methodology, is used for decoding the electrical signals for correcting errors in symbols which are four (4) bits in length. First, the information pertaining to the previously stored data bits, as well as the check bits, are retrieved from the memory array. The address parity bits are generated using the system address of the data. Using the data retrieved from memory and the address parity bits, new check bits are generated to form a 16-bit syndrome vector. The 16-bit syndrome is calculated by the exclusive-or of the new check bits and the retrieved check bits and the syndrome vector is decoded to determine if any of the thirty-two data symbols, four (4) check symbols, or the two (2) address parity symbols are in error. If an error is detected, it may either be corrected or deemed uncorrectable, depending on the type of error.

DETAILED DESCRIPTION OF THE INVENTION

Figure 1:
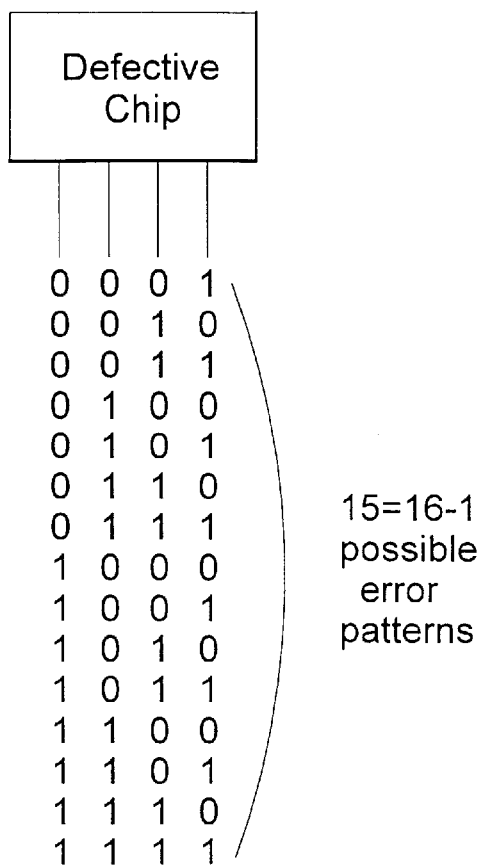
FIG. 1 is a block diagram illustrating the fifteen possible error patterns for a 4-bit wide memory chip.

The present invention is a (146,130) single-symbol correcting double-symbol detecting ECC which also detects address errors. To accomplish this, the invention implements a parity check matrix set forth in Table 1a and Table 1b which is a continuation of Table 1a.

The parity check matrix is used to generate the check bits from the data bits and the address parity bits, during a memory store operation. Each of the sixteen ECC check bits is generated by the exclusive-or of a subset of the data bits and the two address parity bits as indicated by the ones in each row of the parity check matrix. For example, check bit 1 is generated by the exclusive-or of bits 29, 33, 34, 40, 42, 45, 49, 53, 57, 64, 68, 69, 70, 73, 77, 84, 85, 86, 91, 92, 93, 97, 101, 105, 111, 113, 114, 115, 118, 121 and 125 and address parity bits $P_0$ and $P_1$.

TABLE 1a

| | | | | | | Data bits | | | | | | | | | |
|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 |
| 1234 | 5678 | 9111 | 1111 | 1112 | 2222 | 2222 | 2333 | 3333 | 3334 | 4444 | 4444 | 4555 | 5555 | 5556 | 6666 |
|  |  | 012 | 3456 | 7890 | 1234 | 5678 | 9012 | 3456 | 7890 | 1234 | 5678 | 9012 | 3456 | 7890 | 1234 |
| 0000 | 0000 | 0000 | 0000 | 0000 | 0000 | 0000 | 1000 | 1100 | 0001 | 0100 | 1000 | 1000 | 1000 | 1000 | 0001 |
| 0000 | 0000 | 0000 | 0000 | 0000 | 0000 | 0000 | 0100 | 0010 | 1001 | 0110 | 0100 | 0100 | 0100 | 0100 | 1001 |
| 0000 | 0000 | 0000 | 0000 | 0000 | 0000 | 0000 | 0010 | 0001 | 0100 | 0011 | 0010 | 0010 | 0010 | 0010 | 0100 |
| 0000 | 0000 | 0000 | 0000 | 0000 | 0000 | 0000 | 0001 | 1000 | 0010 | 1001 | 0001 | 0001 | 0001 | 0001 | 0010 |
| 1000 | 1000 | 1000 | 0010 | 1110 | 0100 | 1000 | 1000 | 0000 | 0000 | 0000 | 0000 | 0000 | 0000 | 0000 | 1000 |
| 0100 | 0100 | 0100 | 0011 | 0001 | 0110 | 0100 | 0100 | 0000 | 0000 | 0000 | 0000 | 0000 | 0000 | 0000 | 0100 |
| 0010 | 0010 | 0010 | 1001 | 1000 | 0011 | 0010 | 0010 | 0000 | 0000 | 0000 | 0000 | 0000 | 0000 | 0000 | 0010 |
| 0001 | 0001 | 0001 | 0100 | 1100 | 1001 | 0001 | 0001 | 0000 | 0000 | 0000 | 0000 | 0000 | 0000 | 0000 | 0001 |
| 0001 | 1100 | 1000 | 1000 | 0001 | 1100 | 0011 | 1000 | 1000 | 1000 | 1000 | 0010 | 1110 | 0100 | 1000 | 1000 |
| 1001 | 0010 | 0100 | 0100 | 1001 | 0010 | 1010 | 0100 | 0100 | 0100 | 0100 | 0011 | 0001 | 0110 | 0100 | 0100 |
| 0100 | 0001 | 0010 | 0010 | 0100 | 0001 | 1101 | 0010 | 0010 | 0010 | 0010 | 1001 | 1000 | 0011 | 0010 | 0010 |
| 0010 | 1000 | 0001 | 0001 | 0010 | 1000 | 0110 | 0001 | 0001 | 0001 | 0001 | 0100 | 1100 | 1001 | 0001 | 0001 |
| 1100 | 0001 | 0100 | 1000 | 1000 | 1000 | 1000 | 0001 | 0001 | 1100 | 1000 | 1000 | 0001 | 1100 | 0011 | 1000 |
| 0010 | 1001 | 0110 | 0100 | 0100 | 0100 | 0100 | 1001 | 1001 | 0010 | 0100 | 0100 | 1001 | 0010 | 1010 | 0100 |
| 0001 | 0100 | 0011 | 0010 | 0010 | 0010 | 0010 | 0100 | 0100 | 0001 | 0010 | 0010 | 0100 | 0001 | 1101 | 0010 |
| 1000 | 0010 | 1001 | 0001 | 0001 | 0001 | 0001 | 0010 | 0010 | 1000 | 0001 | 0001 | 0010 | 1000 | 0110 | 0001 |

TABLE 1b

| | | | | | | Data bits | | | | | | | | | | | |
|---|---|---|---|---|---|---|---|---|---|---|---|---|---|---|---|---|---|
| 17 | 18 | 19 | 20 | 21 | 22 | 23 | 24 | 25 | 26 | 27 | 28 | 29 | 30 | 31 | 32 | $P_0$ | $P_1$ |
| 6666 | 6777 | 7777 | 7778 | 8888 | 8888 | 8999 | 9999 | 9991 | 1111 | 1111 | 1111 | 1111 | 1111 | 1111 | 1111 | 1 | 2 |
| 5678 | 9012 | 3456 | 7890 | 1234 | 5678 | 9012 | 3456 | 7890 | 0000 | 0000 | 0111 | 1111 | 1112 | 2222 | 2222 |  |  |
|  |  |  |  |  |  |  |  | 0 | 1234 | 5678 | 9012 | 3456 | 7890 | 1234 | 5678 |  |  |
| 0001 | 1100 | 1000 | 1000 | 0001 | 1100 | 0011 | 1000 | 1000 | 1000 | 1000 | 0010 | 1110 | 0100 | 1000 | 1000 | 0 | 0 |
| 1001 | 0010 | 0100 | 0100 | 1001 | 0010 | 1010 | 0100 | 0100 | 0100 | 0100 | 0011 | 0001 | 0110 | 0100 | 0100 | 1 | 0 |
| 0100 | 0001 | 0010 | 0010 | 0100 | 0001 | 1101 | 0010 | 0010 | 0010 | 0010 | 1001 | 1000 | 0011 | 0010 | 0010 | 0 | 0 |
| 0010 | 1000 | 0001 | 0001 | 0010 | 1000 | 0110 | 0001 | 0001 | 0001 | 0001 | 0100 | 1100 | 1001 | 0001 | 0001 | 0 | 1 |
| 1100 | 0001 | 0100 | 1000 | 1000 | 1000 | 1000 | 0001 | 0001 | 1100 | 1000 | 1000 | 0001 | 1100 | 0011 | 1000 | 0 | 1 |
| 0010 | 1001 | 0110 | 0100 | 0100 | 0100 | 0100 | 1001 | 1001 | 0010 | 0100 | 0100 | 1001 | 0010 | 1010 | 0100 | 1 | 0 |
| 0001 | 0100 | 0011 | 0010 | 0010 | 0010 | 0010 | 0100 | 0100 | 0001 | 0010 | 0010 | 0100 | 0001 | 1101 | 0010 | 0 | 0 |
| 1000 | 0010 | 1001 | 0001 | 0001 | 0001 | 0001 | 0010 | 0010 | 1000 | 0001 | 0001 | 0010 | 1000 | 0110 | 0001 | 0 | 0 |
| 0000 | 0000 | 0000 | 0000 | 0000 | 0000 | 1000 | 1100 | 0001 | 0100 | 1000 | 1000 | 1000 | 1000 | 0001 | 0 | 0 |
| 0000 | 0000 | 0000 | 0000 | 0000 | 0000 | 0100 | 0010 | 1001 | 0110 | 0100 | 0100 | 0100 | 0100 | 1001 | 0 | 1 |
| 0000 | 0000 | 0000 | 0000 | 0000 | 0000 | 0010 | 0001 | 0100 | 0011 | 0010 | 0010 | 0010 | 0010 | 0100 | 0 | 0 |

TABLE 1b-continued

| | | | | | | | | Data bits | | | | | | | | | |
|---|---|---|---|---|---|---|---|---|---|---|---|---|---|---|---|---|---|
| 17 | 18 | 19 | 20 | 21 | 22 | 23 | 24 | 25 | 26 | 27 | 28 | 29 | 30 | 31 | 32 | $P_0$ | $P_1$ |
| 0000 | 0000 | 0000 | 0000 | 0000 | 0000 | 0000 | 0001 | 1000 | 0010 | 1001 | 0001 | 0001 | 0001 | 0001 | 0010 | 1 | 0 |
| 1000 | 1000 | 1000 | 0010 | 1110 | 0100 | 1000 | 1000 | 0000 | 0000 | 0000 | 0000 | 0000 | 0000 | 0000 | 1000 | 1 | 0 |
| 0100 | 0100 | 0100 | 0011 | 0001 | 0110 | 0100 | 0100 | 0000 | 0000 | 0000 | 0000 | 0000 | 0000 | 0000 | 0100 | 0 | 1 |
| 0010 | 0010 | 0010 | 1001 | 1000 | 0011 | 0010 | 0010 | 0000 | 0000 | 0000 | 0000 | 0000 | 0000 | 0000 | 0010 | 0 | 0 |
| 0001 | 0001 | 0001 | 0100 | 1100 | 1001 | 0001 | 0001 | 0000 | 0000 | 0000 | 0000 | 0000 | 0000 | 0000 | 0001 | 0 | 0 |

The ECC word is divided into thirty-six (36) groups of 4-bit symbols including: thirty-two (32) data symbols and four (4) check symbols. In storing data, each of the symbols is stored in a different memory chip. The address parity bits are not stored in the memory, even though they participated in the check bit generation. The address parity bits are regenerated during the fetch operation from the system address bits in the same way they were generated during the store operation.

Figure 2:
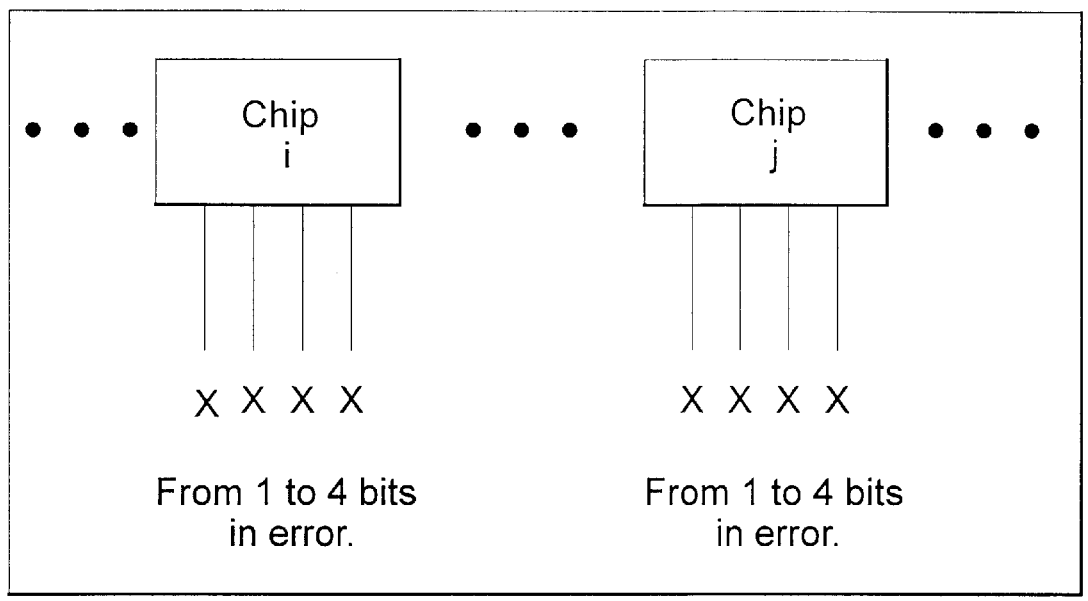
FIGS. 2, 3 and 4 are block diagrams illustrating the limits of error detectability for the current invention.
Figure 3:
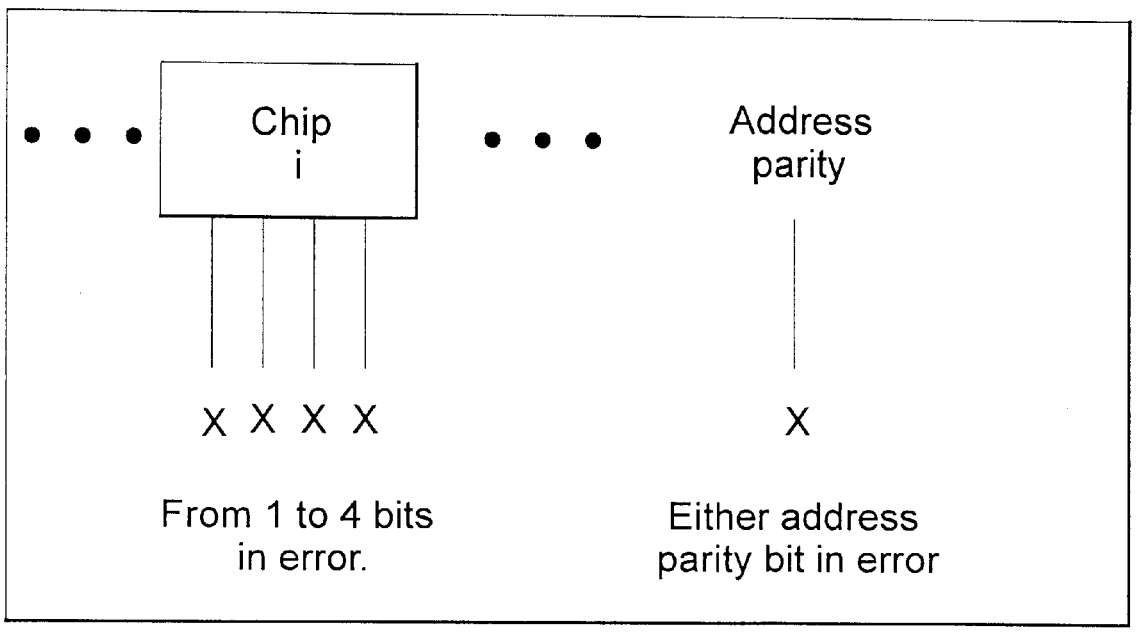
Figure 4:
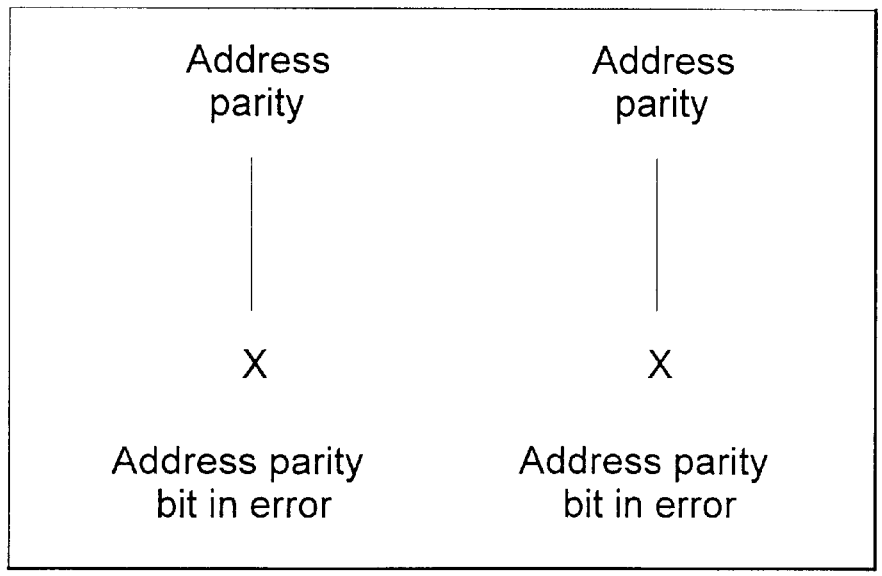

During operation, if a memory chip fails, the data stored in the chip may or may not be in error depending on the data stored. If the data is in error, the number of errors may be one or more than one. FIG. 1 illustrates all of the possible error patterns $2^4-1=15$ for a failed 4-bit wide chip. FIGS. 2, 3, and 4 illustrate the limits of error detectability in the present invention. For instance, FIG. 2 illustrates the case where from one to four bits of two distinct data or check symbols are in error. FIG. 3 shows the case-where from one to four bits of data or check symbol are in error along with a single parity bit error. FIG. 4 shows the case where both address parity bits are in error.

Figure 5:
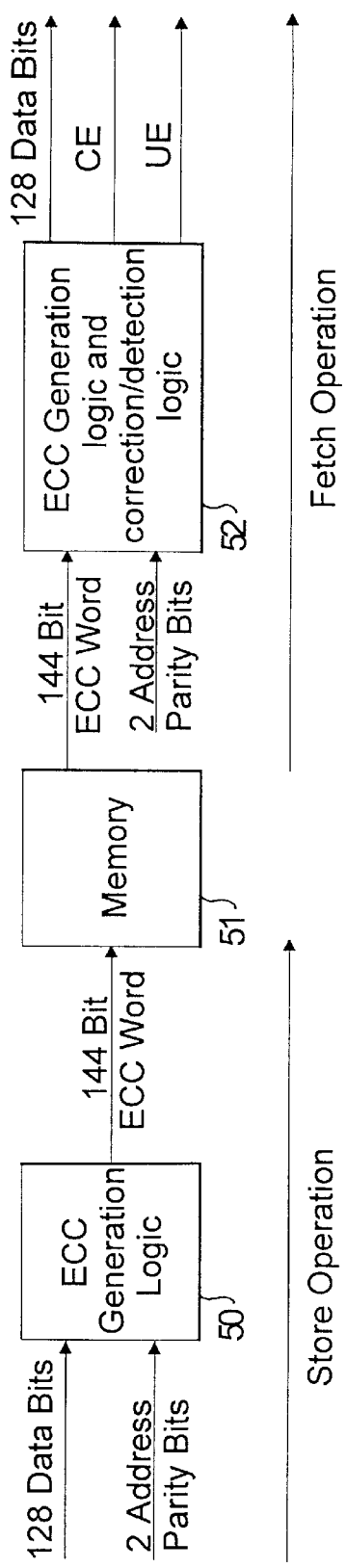
FIG. 5 is a block diagram depicting data store and fetch operations implementing the (146,130) single-symbol correcting double-symbol detecting ECC methodology of the invention.

FIG. 5 is a block diagram depicting data store and fetch operations implementing the (146,130) single-symbol correcting double-symbol detecting ECC methodology of the invention. Particularly, FIG. 5 is a high-level diagram depicting the movement of data through the ECC generation logic, out to memory, back from memory, and through the ECC detection/correction logic. Specifically, as shown in FIG. 5, the 128 data bits (i.e., thirty-two 4-bit symbols) and two address parity bits are fed into an ECC generation logic unit 50 implementing the parity check matrix of Tables 1a, 1b for producing the ECC word comprising the data (128 bits) and the 16 check bits. The ECC word is stored in a memory storage 51, for example. During a subsequent read operation, the ECC word is fetched from memory 51, and an ECC correction/detection logic unit 52 is implemented to determine if there are any errors. If there are no errors, the data bits are passed on to the next stage in the computer system. If there are errors, the ECC correction/detection logic unit will detect them providing that no more than two symbols are in error, and correct them if a single symbol is in error. The detection/correction logic signals the system via CE and UE signals (FIG. 7) when a respective "correctable" or "uncorrectable" error occurs.

Figure 6:
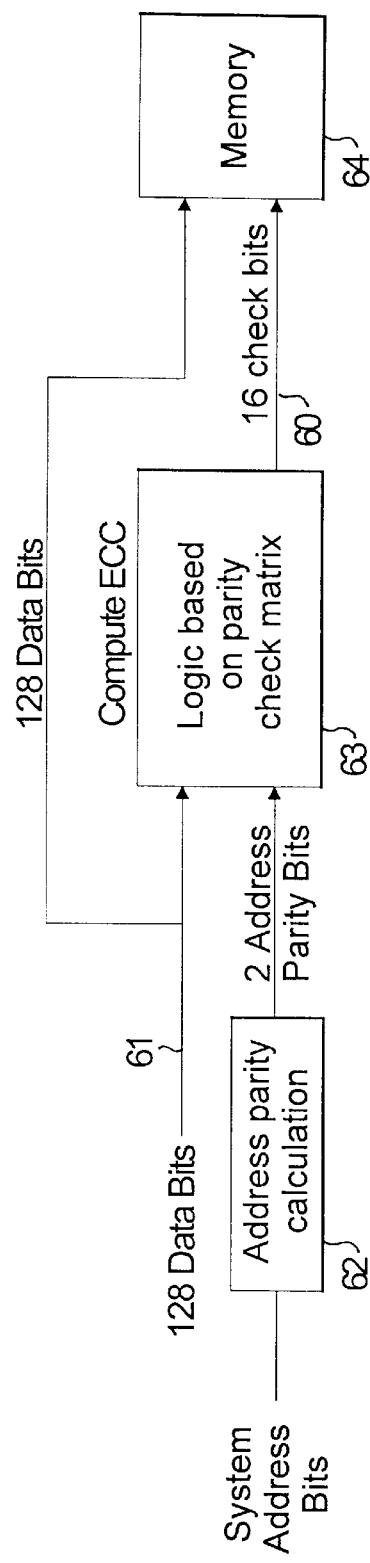
FIG. 6 is a block diagram illustrating the data flow through the ECC generation logic during a store to memory.

FIG. 6 illustrates the flow for a store operation according to the system of the invention. As illustrated in FIG. 6, during a store operation, the sixteen ECC check bits 60 are generated from the 128 data bits 61 and the system address bits 62. The 16 ECC check bits are generated as previously discussed from the equations described by the parity check matrix 63. The entire ECC word, consisting of the 128 data bits and sixteen check bits, is then stored into memory 64 to be decoded later during a fetch operation.

Figure 7:
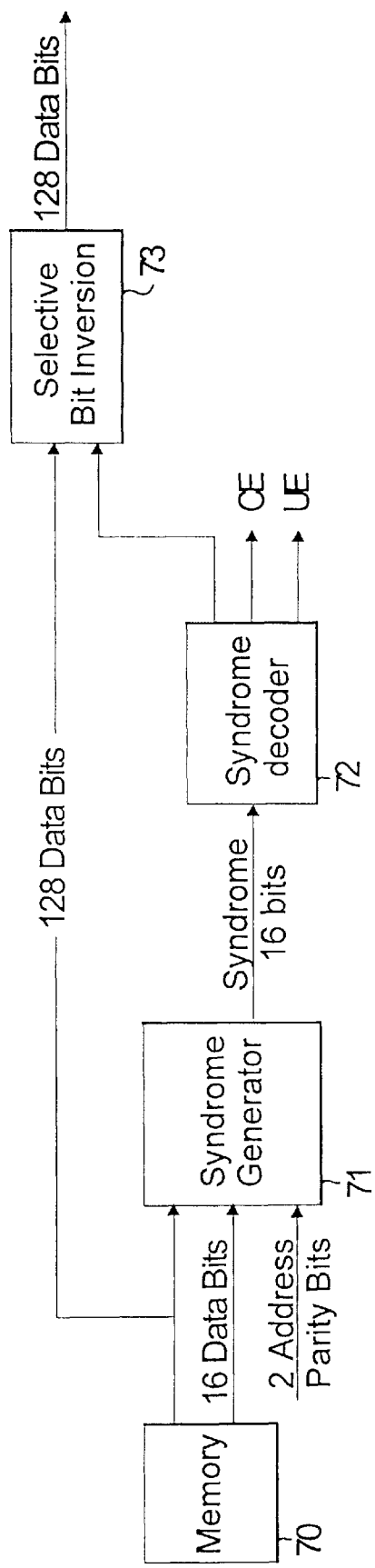
FIG. 7 is a block diagram illustrating the data flow through the ECC detection/correction logic during a fetch from memory.

FIG. 7 illustrates the flow for a fetch operation according to the system of the invention. As illustrated in FIG. 6, the ECC word is fetched from memory 70. The syndrome generator 71 receives the 128 fetched data bits and two address parity bits as input and by the exclusive-or of bits indicated by the parity check matrix (Tables 1a, 1b), computes a 16-bit partial syndrome vector in the same manner as how the check bits were computed for a store operation. The syndrome vector is then calculated by the exclusive-or of the partial syndrome vector and the sixteen fetched check bits. For example, syndrome bit n is the exclusive-or of partial syndrome bit n and fetched check bit n.

This operation is identical to multiplying the entire fetched ECC word with the parity check matrix including the 128 fetched data bits, 16 check bits and two address parity bits for a total of 146 bits as shown in the parity check matrix of Tables 1a, 1b.

As further shown in FIG. 7, the syndrome bits may be decoded to identify any possible errors in the fetched data by the syndrome decoder 72. If the syndrome bits of the syndrome vector are all zero, then no errors are present. However, if there exists a non-zero syndrome bit, symbol error indicators E1–E38 are computed according to the formulae provided below to detect the general and indicate any specific errors. That is, the error indicators are used to select which symbol to correct in the case of a correctable error. The sixteen syndrome bits of the syndrome vector are numbered from S1 to S16. The 38 symbol error indicators are numbered from E1 to E38 where E1 through E32 indicate data symbol errors (corresponding 4-bit nibbles of the 128 data bits), E33 through E36 indicate check symbol errors, and E37 and E38 indicate address parity symbol errors.

E1={S1=0}{S2=0}{S3=0}{S4=0}{S9=S8}{S10=(S5 XOR S8)}{S11=S6 S12=S7}{S13=(S5 XOR S6)}{S14=S7}{S15}{S16=S5}

E2={S1=0}{S2=0}{S3=0}{S4=0}{(S5 XOR S6)}{S10=S7}{S11=S8}{S12=S5}{S13=S8}{S14=(S5 XOR S8)}{S15=S6}{S16==S7}

E3={S1=0}{S2=0}{S3=0}{S4=0}{S9=S5}{S10=S6}{S11=S7}{S12=S8}{S13=S6}{S14=(S6 XOR S7)}{S15=(S7 XOR S8 )}{S16=(S5 XOR S8)}

E4={S1=0}{S2=0}{S3=0}{S4=0}{S5=S11}{S6=(S11 XOR S12)}{S7=(S9 XOR S12)}{S8=S10}{S13=S9}{S14=S10}{S15=S11}{S16=S12}

E5,={S1=0}{S2=0}{S3=0}{S4=0}{S5=(S13 XOR S14 XOR S15 )}{S6=S16}{S7=S13}{S8=(S13 XOR S14)}{S9=S=S16}{S10=(S13 XOR S16)}{S11=S14}{S12=S15}

E6={S1=0}{S2=0}{S3 0}{S4=0}{S5=S14}{S6=(S14 XOR S15) }{S7=(S15 XOR S16)}{S8=(S13 XOR S16)}{(S9=(S13 XOR S14)}{S10=S15}{S11=S16)(S12=S13}

E7={S1=0}{S2=}{S3=0}{S4=0}{S9=(S7 XOR S8)}{(S10=(S5 XOR S7))(S11=(S5 XOR S6 XOR S8)}{S12=(S6 XOR S7)}{S13

E8={S5=S1}{S6=S2}{S7=S3 (S8=S4}{S9=S1}{S10=S2}{S11=S3}{S12=S4}S13=S4 }{S14=(S1 XOR 54)}{S15=S2 }{S16=S3}

E9={S1=(S9 XOR S10)}{S2=S11}{S3=S12}{S4=S9}{S5=0}{S6=0}{S7=0}{S8=0}{S13=S12}{S14=(S9 XOR S12)}{S15=S10}{S16=S11}

E10={S1=S12}{S2=(S9 XOR S12))}{S3=10){S4=S11 {S5=0}{S6=0}{S7 0}(S8=0){S13=(S9 XOR S10)}{S14=S11}{S15=S12}{S16=S9}

E11={S1=S10}{S2=(S10 XOR S11)}(S3=(S11 XOR S12)}{S4=(S9 XOR S12)}{S5=0}{S6=0}{S7=0}{S8=0}{S13=S9}{S14=S10}{S15=S11}{S16=S12}

E12={S5=0}{(S6=0}{S7=0}{S8=0}{S9=S3}{S10=(S3 XOR S4)J}{S11=(S1 XOR S4)}{S12=S2}{S13=S1}{S14=S2}{S15=S3}{S16=S4}

E13={S5=0}{S6=0}{S7=0}{S8=0}{S9=(S1 XOR S2 XOR S3 )}{S10=S4}{S11=S1}{S12=(S1 XOR S2)}{S13=S4}{S14=(S1 XOR S4)}{S15=S2}{S16=}

E14={S5=0}{S6=0}{S7=0}{S8=0}{S9=S2}{S10=(S2 XOR S3)}{(S11=(S3 XOR S4)}{(S12=(S1 XOR S4)}{(S13 (S1 XOR S2 )}{S14=S3}{S15=S4}{S16=S1}

E15={S5=0}{S6=0}{S7=0}{S8=0}{S9=S1}{S10=S2}{S11=S3}{S12=S4)(S13=(S3 XOR S4)}{S14=(S1 XOR S3)}{(S15=(S1 XOR S2 XOR S4))}{{S16=(S2 XOR S3)}

E16={S1=S8}{S2=(S5 XOR S8)}{S3=S6}{S4=S7}{S9=S5}{S10=S6)}{S11=S7}{S12=S8}{S13=S5}{S14=S6}{S15=S7}{S16=S8}

E17={S1=S16}{S2=(S13 XOR S16)}{S3=S14}{S4=S15}{S5=(S13 XOR S14)}{S6=S15}{S7=S16}{S8=S13}{S9=0}{S10=0}{S11=0}{S12=0}

E18=S1=(S13 XOR S14)}{S2 S15}{S3=S16}{S4=S13}{S5=S16}{S6=(S13 XOR S16)}{S7=S14}{S8=S15}{S9=0}{S10=0}{S11=0}{S12=0}

E19={S5=S2}{S6=(S2 XOR S3)}{S7=(S3 XOR S4)}{S8=(S1 XOR S4)}{S9=0}{S10=0}{S11=0}{S12=0}{S13=S1}{S14 =S2}{S15=S3}3 S16=S4}

E20={S5=S1}{S6=S2}{S7=S3}{S8=S4}{S9=0}{S10=0}{S11=0}{S12=0}{S13=S3}{S14=(S3 XOR S4)}{S15=(S1 XOR S4)}{S16=S2}

E21={S1=S8}{S2=(S5 XOR S8)}{S3=S6}{S4=S7}{S9=0}{S10=0}{S11=0}{S12=0}{S13=(S5 XOR S6 XOR S7)}{S14=S8}{S15=S5}{S16=(S5 XOR S6)}

E22={S1=(S5 XOR S6){S(S2=S7}{S3=S8}{S4=S5}{S9=0}{S10=0}{S11=0}{S12=0}{S13=S6}(S14=(S6 XOR S7)}{S15 =(S7 XOR S8)}{S16=(S5 XOR S8)}

E23=(S1=(S7 XOR S8)}(S2=(S5 XOR S7)}{S3=(S5 XOR S6 XOR S8)}{S4=(S6 XOR S7)}{S9=0}{S10=0}{S11=0}{S12=0}{S13 =S5}{S14=S6}{S15=S7}{S16=S8}

E24={S5 S4}{S6=(S1 XOR S4))}{S7=S2}{S8=S3}{S9=S1) S10=S2}{S11=S3}{S12=S4}{S13=S1}{S14=S2}{S15=S3}{S16=S4}

E25 {S5=S4}{S6=(S1 XOR S4)}{S7=S2}{S8=S3}{S9=(S1 XOR S2)}{S10=S3}{S11=S4}{S12=S1}{S13=0}{S14=0}{S15 =0}{S16=0}

E26={S5=(S1 XOR S2)}{S6=S3}{S7=S4}{S8=S1}{S9=S4 }{S10=(S1 XOR S4)}{S11=S2}{S12=S3}{S13=0}{S14=0}{S15=0}{S16=0}

E27={S5=51}{S6=S2}{S7=S3}{S8=S4}{S9=S2}{S10=(S2 XOR S3)}{S11=(S3 XOR S4)}{S12=(S1 XOR S4)}{S13=0}{S14=0}{S15=0}{S16=0}

E28={S1=S7}{S2=(S7 XOR S8) {S3=(S5 XOR S8)}{4=S6}{S9=S5}{S10=S6}{S11=S7 S12=S8}{S13=0}{S14=0}{S15=0}{S16=0}

E29={S1=(S9 XOR S1 XOR S11)}{S2=S12}{S3=S9}{S4=(S9 XOR S10)}{S5=S12}{S6=(S9 XOR S12)}{S7=S10}{S8=S11}{S13 =0}S14=0}{S15=0}{S16=0}

E30 {S1=S10}{S2=(S10 XOR S11))}{S3=(S11 XOR S12)}{(S4=(S9 XOR S12)}{(S5=(S9 XOR S10)}{S6 S11}{S7 S12}{S8=S9 }{S13=0}{S14=0}{S15 0}{S16=0}

E31={S5=S3 XOR S4)}{S6=(S1 XOR S3)}{S7=(S1 XOR 32 XOR S4)}{S8=(S2 XOR S3)}{S9=S1}{(S10=S2)}{S11=S3}{S12=S4}{S13=0}{S14=0}{S15=0}{S16=0}

E32={S5=S1}{S6 S2}{S7 S3}{=S4}{S9=S4}{S10=(S1 XOR S4)}{S11=S2}{S12=S3}{S13=S1}{S14=S2}{S15=S3}{S16=S4}

E33={S5=0}{S6=0}{S7=0}{S8=0}{S9 0}{S10==0}{S11=0}{S12=0}{S14=0}{S15=0}{S16 0}

E34={S1=0}{S2=0}{S3=0}{S4 0}{S9=0}{S10=0}{S11=0}{S12=0}{S13=0}{S14=0}{S15=0}{S16=0}

E35={S1=0}{S2=0}{S33=0}{S4=0}{S5=0}{S6=0}{S7=0}{S8=0}{S13=0}{S14=0}{S15=0}{S16=0}

E36={S1=0}{S2=0}{S3=0}{S4=0}{S5=0}{S6=0}{S7=0}{S8=0}{S9=0}{S10=0}{S11=0}{S12=0}

E37={S1=0}{S2=1}{S3=0}{S4=}{S5=0}{S6=1}{S7=0}{S8=0}{S9=0}{S10=0}{S11=0}{S12=1}{S13=1}{S14=0}{S15=0}{S16=0}

E38={S1=0}{S2=0}{S3=0}{S4=1}{S5=1}{S6=0}{S7=0}{S8=0}{S9=0}{S10=1}{S11=0}{S12=0}{S13=0}{S14=1}{S15=0}{S16=0}

Thus, for example, if the computed error indicator E1 is a 1 (and the syndrome vector is non-zero) then this would indicate an error in symbol 1 (e.g., a four bit nibble). Likewise, an error in symbol 15 will cause E15 to be 1.

Referring back to FIG. 3, individual bits of an errant symbol are inverted by the selective bit inversion device 73 to correct the individual bit errors within the error symbol. Bits are chosen to be inverted based on the error indicator, E1 through E32, and an error pattern which is part of the syndrome. E33 through E36 are never corrected since these indicators flag a check symbol error. E37 and E38 indicate an address parity error which is an uncorrectable (UE) and thus cannot be corrected. The error patterns for the data symbols are provided below.

Error pattern for symbols 8, 13, 14, 20, 25, 26, 27, 31, 33 =(S1, S2, S3, S4).

Error pattern for symbols 1, 2, 3, 7, 16, 21, 22, 28, 34 =(S5, S6, S7, S8)

Error pattern for symbols 4, 9, 10, 11, 15, 24, 29, 30, 35 (S9, S10, S11, S12)

Error pattern for symbols 5, 6, 12, 17, 18, 19, 23, 32, 36 =(S13, S14, S15, S16)

Application of these error patterns is as follows: Let (Dn1, Dn2, Dn3, Dn4) be the bits of data symbol n. The corrected data bit m of the n-th symbol is the exclusive-or of the error pattern. For example, if symbol 5 has an error as evidenced by E5 being a 1, then bit 1 of symbol 5 is exclusive-or'd with S13, bit 2 with S14, bit 3 with S15, and bit 4 with S16. Thus, the whole nibble for symbol 5 will be corrected by selective inversion of the bits. If the syndrome is not all zeros, i.e., at least one of the sixteen syndrome bits is 1, and none of the thirty-eight error indicators is 1, then an uncorrectable error (UE) is flagged. An UE is also flagged when one or both of E37 or E38, the address parity symbols, are 1.

Figure 8:
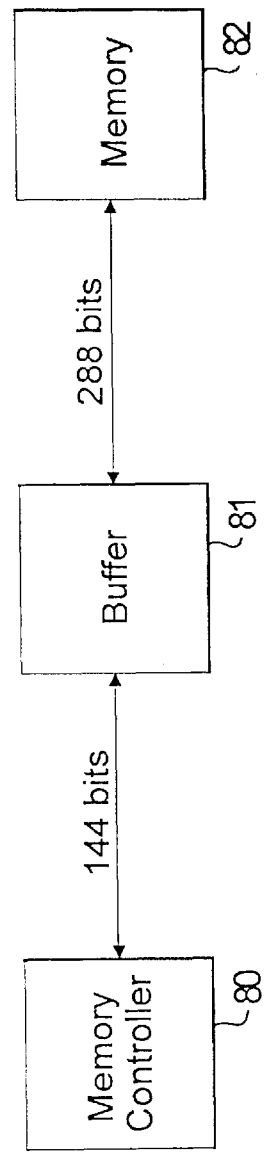
FIG. 8 is a diagram of a memory system with a 144-bit memory controller interfacing to a 288-bit memory via an intermediate buffer.

Although this (146,130) ECC code is designed with a symbol width of four bits and is, therefore, naturally suited to memory systems with 4-bit wide memory chips, it can be effectively used in memory systems where the memory chips are eight bits wide while supporting single chip failure correction and double chip failure detection. In order to support the correction of an 8-bit wide memory chip, the width of the main memory must be doubled from 144 bits to 288 bits as shown in FIG. 8. An intermediate buffer chip 81 is added to the data path between the memory controller 80 and the memory 82. The function of the buffer chip 81 during a memory write is to collect in registers two consecutive 144 bit data words and write them to the memory as a single 288 bit data word. The function of the buffer chip during a memory read is opposite that for a memory write with the addition of a data selector for selecting which 144 bit datum to place on the memory controller bus.

Figure 9:
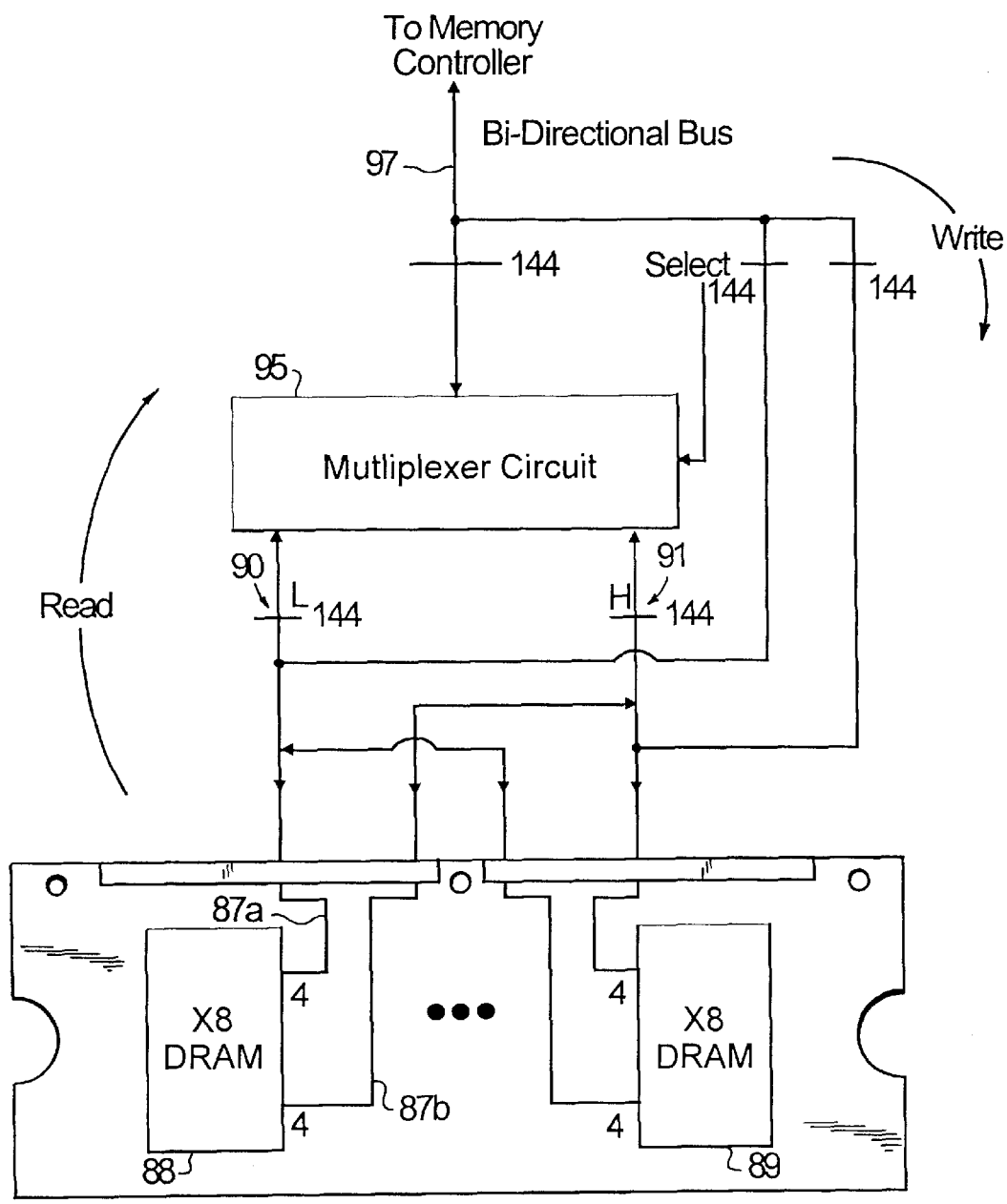
FIG. 9 is a diagram illustrating a memory system design for connecting the symbols of two 144-bit data words to 8-bit wide memory devices making possible the correction of single 8-bit wide chip failures and the detection of two 8-bit wide chip failures.

FIG. 9 illustrates the construction of a 288-bit memory to support 8-bit wide chips. In FIG. 9, the 288-bit data word comprises two 144-bit words 90 and 91. FIG. 9 particularly illustrates an example construction of using the same ECC code to cover standard 8-bit wide DRAM chips 88, 89 by enabling the use of the ECC code derived herein which is based on 4-bit nibbles, and applying it in such a way that 8-bit nibble failures may be corrected. This is accomplished by retrieving two consecutive 144's in an interleaved fashion. For example, each 4-bit symbol of the 144-bit word 90 occupies half of a distinct 8-bit memory chip while each 4-bit symbol of the 144-bit word 91 occupies the remaining half of distinct 8-bit wide memory chips. That is, every time each 144-bit ECC word is read, a first 4-bit symbol, e.g., comprising low order bits 87a, is taken from a first 8-bit wide DRAM chip 88 while it's successive 4-bit symbol, e.g., comprising high order bits 87b, is taken from the same 8-bit wide DRAM chip 88 in an interleaved fashion. Thus, in the event of an 8-bit wide DRAM chip failure, the system will still operate since the two 4-bit symbols making up the 8-bits will be consecutively ECC corrected due to the interleaving. When the first data is read, for example, there would be a single symbol failure that is able to corrected. The multiplexor circuit 95 is provided to select either the data word from words 90, 91 and place them on the bi-directional bus 97 interfaced to a memory controller (not shown).

Thus, in the topology depicted in FIG. 9, an error may be distributed in two consecutive unique code words.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method of encoding data in a 144-bit data stream being transmitted in a computer system using a (146,130) error correcting code, comprising the steps of:

generating two address parity bits from the system address of a 128 bit data word to be encoded;

encoding 16 check bits into the data stream implementing a logic circuit based on a parity check matrix applied to said 128 bit data word and said address parity bits;

storing said check bits and said data in the memory of a computer system, wherein said parity check matrix comprises:

TABLE 1a

| | | | | Data bits | | | | | |
|---|---|---|---|---|---|---|---|---|---|
| 1 | 2 | 3 | 4 | 5 | 6 | 7 | 8 | 9 | 10 |
| 1234 | 5678 | 9111 012 | 1111 3456 | 1112 7890 | 2222 1234 | 2222 5678 | 2333 9012 | 3333 3456 | 3334 7890 |
| 0000 | 0000 | 0000 | 0000 | 0000 | 0000 | 0000 | 1000 | 1100 | 0001 |
| 0000 | 0000 | 0000 | 0000 | 0000 | 0000 | 0000 | 0100 | 0010 | 1001 |
| 0000 | 0000 | 0000 | 0000 | 0000 | 0000 | 0000 | 0010 | 0001 | 0100 |
| 0000 | 0000 | 0000 | 0000 | 0000 | 0000 | 0000 | 0001 | 1000 | 0010 |

TABLE 1a-continued

| | | | | Data bits | | | | | |
|---|---|---|---|---|---|---|---|---|---|
| 1000 | 1000 | 1000 | 0010 | 1110 | 0100 | 1000 | 1000 | 0000 | 0000 |
| 0100 | 0100 | 0100 | 0011 | 0001 | 0110 | 0100 | 0100 | 0000 | 0000 |
| 0010 | 0010 | 0010 | 1001 | 1000 | 0011 | 0010 | 0010 | 0000 | 0000 |
| 0001 | 0001 | 0001 | 0100 | 1100 | 1001 | 0001 | 0001 | 0000 | 0000 |
| 0001 | 1100 | 1000 | 1000 | 0001 | 1100 | 0011 | 1000 | 1000 | 1000 |
| 1001 | 0010 | 0100 | 0100 | 1001 | 0010 | 1010 | 0100 | 0100 | 0100 |
| 0100 | 0001 | 0010 | 0010 | 0100 | 0001 | 1101 | 0010 | 0010 | 0010 |
| 0010 | 1000 | 0001 | 0001 | 0010 | 1000 | 0110 | 0001 | 0001 | 0001 |
| 1100 | 0001 | 0100 | 1000 | 1000 | 1000 | 1000 | 0001 | 0001 | 1100 |
| 0010 | 1001 | 0110 | 0100 | 0100 | 0100 | 0100 | 1001 | 1001 | 0010 |
| 0001 | 0100 | 0011 | 0010 | 0010 | 0010 | 0010 | 0100 | 0100 | 0001 |
| 1000 | 0010 | 1001 | 0001 | 0001 | 0001 | 0001 | 0010 | 0010 | 1000 |

| 11 | 12 | 13 | 14 | 15 | 16 |
|---|---|---|---|---|---|
| 4444 1234 | 4444 5678 | 4555 9012 | 5555 3456 | 5556 7890 | 6666 1234 |
| 0100 | 1000 | 1000 | 1000 | 1000 | 0001 |
| 0110 | 0100 | 0100 | 0100 | 0100 | 1001 |
| 0011 | 0010 | 0010 | 0010 | 0010 | 0100 |
| 1001 | 0001 | 0001 | 0001 | 0001 | 0010 |
| 0000 | 0000 | 0000 | 0000 | 0000 | 1000 |
| 0000 | 0000 | 0000 | 0000 | 0000 | 0100 |
| 0000 | 0000 | 0000 | 0000 | 0000 | 0010 |
| 0000 | 0000 | 0000 | 0000 | 0000 | 0001 |
| 1000 | 0010 | 1110 | 0100 | 1000 | 1000 |
| 0100 | 0011 | 0001 | 0110 | 0100 | 0100 |
| 0010 | 1001 | 1000 | 0011 | 0010 | 0010 |
| 0001 | 0100 | 1100 | 1001 | 0001 | 0001 |
| 1000 | 1000 | 0001 | 1100 | 0011 | 1000 |
| 0100 | 0100 | 1001 | 0010 | 1010 | 0100 |
| 0010 | 0010 | 0100 | 0001 | 1101 | 0010 |
| 0001 | 0001 | 0010 | 1000 | 0110 | 0001 |

TABLE 1b

| | | | | Data bits | | | | | |
|---|---|---|---|---|---|---|---|---|---|
| 17 | 18 | 19 | 20 | 21 | 22 | 23 | 24 | 25 | 26 |
| 6666 5678 | 6777 9012 | 7777 3456 | 7778 7890 | 8888 1234 | 8888 5678 | 8999 9012 | 9999 3456 | 9991 7890 0 | 1111 0000 1234 |
| 0001 | 1100 | 1000 | 1000 | 0001 | 1100 | 0011 | 1000 | 1000 | 1000 |
| 1001 | 0010 | 0100 | 0100 | 1001 | 0010 | 1010 | 0100 | 0100 | 0100 |
| 0100 | 0001 | 0010 | 0010 | 0100 | 0001 | 1101 | 0010 | 0010 | 0010 |
| 0010 | 1000 | 0001 | 0001 | 0010 | 1000 | 0110 | 0001 | 0001 | 0001 |
| 1100 | 0001 | 0100 | 1000 | 1000 | 1000 | 1000 | 0001 | 0001 | 1100 |
| 0010 | 1001 | 0110 | 0100 | 0100 | 0100 | 0100 | 1001 | 1001 | 0010 |
| 0001 | 0100 | 0011 | 0010 | 0010 | 0010 | 0010 | 0100 | 0100 | 0001 |
| 1000 | 0010 | 1001 | 0001 | 0001 | 0001 | 0001 | 0010 | 0010 | 1000 |
| 0000 | 0000 | 0000 | 0000 | 0000 | 0000 | 1000 | 1100 | 0001 | |
| 0000 | 0000 | 0000 | 0000 | 0000 | 0000 | 0100 | 0010 | 1001 | |
| 0000 | 0000 | 0000 | 0000 | 0000 | 0000 | 0010 | 0001 | 0100 | |
| 0000 | 0000 | 0000 | 0000 | 0000 | 0000 | 0001 | 1000 | 0010 | |
| 1000 | 1000 | 1000 | 0010 | 1110 | 0100 | 1000 | 1000 | 0000 | 0000 |
| 0100 | 0100 | 0100 | 0011 | 0001 | 0110 | 0100 | 0100 | 0000 | 0000 |
| 0010 | 0010 | 0010 | 1001 | 1000 | 0011 | 0010 | 0010 | 0000 | 0000 |
| 0001 | 0001 | 0001 | 0100 | 1100 | 1001 | 0001 | 0001 | 0000 | 0000 |

| | | | Data bits | | | | |
|---|---|---|---|---|---|---|---|
| 27 | 28 | 29 | 30 | 31 | 32 | $P_0$ | $P_1$ |
| 1111 5678 | 1111 9012 | 1111 3456 | 1111 7890 | 1111 1234 | 1111 5678 | 1 | 2 |
| 0000 | 0111 | 1111 | 1112 | 2222 | 2222 | | |
| 1000 | 0010 | 1110 | 0100 | 1000 | 1000 | 0 | 0 |
| 0100 | 0011 | 0001 | 0110 | 0100 | 0100 | 1 | 0 |
| 0010 | 1001 | 1000 | 0011 | 0010 | 0010 | 0 | 0 |
| 0001 | 0100 | 1100 | 1001 | 0001 | 0001 | 0 | 1 |
| 1000 | 1000 | 0001 | 1100 | 0011 | 1000 | 0 | 1 |
| 0100 | 0100 | 1001 | 0010 | 1010 | 0100 | 1 | 0 |
| 0010 | 0010 | 0100 | 0001 | 1101 | 0010 | 0 | 0 |

TABLE 1b-continued

| | | | | | | | |
|---|---|---|---|---|---|---|---|
| 0001 | 0001 | 0010 | 1000 | 0110 | 0001 | 0 | 0 |
| 0100 | 1000 | 1000 | 1000 | 1000 | 0001 | 0 | 0 |
| 0110 | 0100 | 0100 | 0100 | 0100 | 1001 | 0 | 1 |
| 0011 | 0010 | 0010 | 0010 | 0010 | 0100 | 0 | 0 |
| 1001 | 0001 | 0001 | 0001 | 0001 | 0010 | 1 | 0 |
| 0000 | 0000 | 0000 | 0000 | 0000 | 1000 | 1 | 0 |
| 0000 | 0000 | 0000 | 0000 | 0000 | 0100 | 0 | 1 |
| 0000 | 0000 | 0000 | 0000 | 0000 | 0010 | 0 | 0 |
| 0000 | 0000 | 0000 | 0000 | 0000 | 0001 | 0 | 0 | a) retrieving said check bits and a data word from the memory of a computer system;

b) generating two address parity bits from the system address of the data word;

c) decoding the data stream retrieved from memory implementing a logic circuit based on a parity check matrix applied to the data word and the address parity bits to produce a 16-bit syndrome, said parity check matrix comprising:

TABLE 1a

| | | | | | | | Data bits | | | | | | | | |
|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 |
| 1234 | 5678 | 9111 | 1111 | 1112 | 2222 | 2222 | 2333 | 3333 | 3334 | 4444 | 4444 | 4555 | 5555 | 5556 | 6666 |
| | | 012 | 3456 | 7890 | 1234 | 5678 | 9012 | 3456 | 7890 | 1234 | 5678 | 9012 | 3456 | 7890 | 1234 |
| 0000 | 0000 | 0000 | 0000 | 0000 | 0000 | 0000 | 1000 | 1100 | 0001 | 0100 | 1000 | 1000 | 1000 | 1000 | 0001 |
| 0000 | 0000 | 0000 | 0000 | 0000 | 0000 | 0000 | 0100 | 0010 | 1001 | 0110 | 0100 | 0100 | 0100 | 0100 | 1001 |
| 0000 | 0000 | 0000 | 0000 | 0000 | 0000 | 0000 | 0010 | 0001 | 0100 | 0011 | 0010 | 0010 | 0010 | 0010 | 0100 |
| 0000 | 0000 | 0000 | 0000 | 0000 | 0000 | 0000 | 0001 | 1000 | 0010 | 1001 | 0001 | 0001 | 0001 | 0001 | 0010 |
| 1000 | 1000 | 1000 | 0010 | 1110 | 0100 | 1000 | 1000 | 0000 | 0000 | 0000 | 0000 | 0000 | 0000 | 0000 | 1000 |
| 0100 | 0100 | 0100 | 0011 | 0001 | 0110 | 0100 | 0100 | 0000 | 0000 | 0000 | 0000 | 0000 | 0000 | 0000 | 0100 |
| 0010 | 0010 | 0010 | 1001 | 1000 | 0011 | 0010 | 0010 | 0000 | 0000 | 0000 | 0000 | 0000 | 0000 | 0000 | 0010 |
| 0001 | 0001 | 0001 | 0100 | 1100 | 1001 | 0001 | 0001 | 0000 | 0000 | 0000 | 0000 | 0000 | 0000 | 0000 | 0001 |
| 0001 | 1100 | 1000 | 1000 | 0001 | 1100 | 0011 | 1000 | 1000 | 1000 | 1000 | 0010 | 1110 | 0100 | 1000 | 1000 |
| 1001 | 0010 | 0100 | 0100 | 1001 | 0010 | 1010 | 0100 | 0100 | 0100 | 0100 | 0011 | 0001 | 0110 | 0100 | 0100 |
| 0100 | 0001 | 0010 | 0010 | 0100 | 0001 | 1101 | 0010 | 0010 | 0010 | 0010 | 1001 | 1000 | 0011 | 0010 | 0010 |
| 0010 | 1000 | 0001 | 0001 | 0010 | 1000 | 0110 | 0001 | 0001 | 0001 | 0001 | 0100 | 1100 | 1001 | 0001 | 0001 |
| 1100 | 0001 | 0100 | 1000 | 1000 | 1000 | 1000 | 0001 | 0001 | 1100 | 1000 | 1000 | 0001 | 1100 | 0011 | 1000 |
| 0010 | 1001 | 0110 | 0100 | 0100 | 0100 | 0100 | 1001 | 1001 | 0010 | 0100 | 0100 | 1001 | 0010 | 1010 | 0100 |
| 0001 | 0100 | 0011 | 0010 | 0010 | 0010 | 0010 | 0100 | 0100 | 0001 | 0010 | 0010 | 0100 | 0001 | 1101 | 0010 |
| 1000 | 0010 | 1001 | 0001 | 0001 | 0001 | 0001 | 0010 | 0010 | 1000 | 0001 | 0001 | 0010 | 1000 | 0110 | 0001 |

TABLE 1b

| | | | | | | | Data bits | | | | | | | | | | |
|---|---|---|---|---|---|---|---|---|---|---|---|---|---|---|---|---|---|
| 17 | 18 | 19 | 20 | 21 | 22 | 23 | 24 | 25 | 26 | 27 | 28 | 29 | 30 | 31 | 32 | $P_0$ | $P_1$ |
| 6666 | 6777 | 7777 | 7778 | 8888 | 8888 | 8999 | 9999 | 9991 | 1111 | 1111 | 1111 | 1111 | 1111 | 1111 | 1111 | 1 | 2 |
| 5678 | 9012 | 3456 | 7890 | 1234 | 5678 | 9012 | 3456 | 7890 | 0000 | 0000 | 0111 | 1111 | 1112 | 2222 | 2222 | | |
| | | | | | | | | 0 | 1234 | 5678 | 9012 | 3456 | 7890 | 1234 | 5678 | | |
| 0001 | 1100 | 1000 | 1000 | 0001 | 1100 | 0011 | 1000 | 1000 | 1000 | 1000 | 0010 | 1110 | 0100 | 1000 | 1000 | 0 | 0 |
| 1001 | 0010 | 0100 | 0100 | 1001 | 0010 | 1010 | 0100 | 0100 | 0100 | 0100 | 0011 | 0001 | 0110 | 0100 | 0100 | 1 | 0 |
| 0100 | 0001 | 0010 | 0010 | 0100 | 0001 | 1101 | 0010 | 0010 | 0010 | 0010 | 1001 | 1000 | 0011 | 0010 | 0010 | 0 | 0 |
| 0010 | 1000 | 0001 | 0001 | 0010 | 1000 | 0110 | 0001 | 0001 | 0001 | 0001 | 0100 | 1100 | 1001 | 0001 | 0001 | 0 | 1 |
| 1100 | 0001 | 0100 | 1000 | 1000 | 1000 | 1000 | 0001 | 0001 | 1100 | 1000 | 1000 | 0001 | 1100 | 0011 | 1000 | 0 | 1 |
| 0010 | 1001 | 0110 | 0100 | 0100 | 0100 | 0100 | 1001 | 1001 | 0010 | 0100 | 0100 | 1001 | 0010 | 1010 | 0100 | 1 | 0 |
| 0001 | 0100 | 0011 | 0010 | 0010 | 0010 | 0010 | 0100 | 0100 | 0001 | 0010 | 0010 | 0100 | 0001 | 1101 | 0010 | 0 | 0 |
| 1000 | 0010 | 1001 | 0001 | 0001 | 0001 | 0001 | 0010 | 0010 | 1000 | 0001 | 0001 | 0010 | 1000 | 0110 | 0001 | 0 | 0 |
| 0000 | 0000 | 0000 | 0000 | 0000 | 0000 | 0000 | 1000 | 1100 | 0001 | 0100 | 1000 | 1000 | 1000 | 1000 | 0001 | 0 | 0 |
| 0000 | 0000 | 0000 | 0000 | 0000 | 0000 | 0000 | 0100 | 0010 | 1001 | 0110 | 0100 | 0100 | 0100 | 0100 | 1001 | 0 | 1 |
| 0000 | 0000 | 0000 | 0000 | 0000 | 0000 | 0000 | 0010 | 0001 | 0100 | 0011 | 0010 | 0010 | 0010 | 0010 | 0100 | 0 | 0 |
| 0000 | 0000 | 0000 | 0000 | 0000 | 0000 | 0000 | 0001 | 1000 | 0010 | 1001 | 0001 | 0001 | 0001 | 0001 | 0010 | 1 | 0 |
| 1000 | 1000 | 1000 | 0010 | 1110 | 0100 | 1000 | 1000 | 0000 | 0000 | 0000 | 0000 | 0000 | 0000 | 0000 | 1000 | 1 | 0 |
| 0100 | 0100 | 0100 | 0011 | 0001 | 0110 | 0100 | 0100 | 0000 | 0000 | 0000 | 0000 | 0000 | 0000 | 0000 | 0100 | 0 | 1 |
| 0010 | 0010 | 0010 | 1001 | 1000 | 0011 | 0010 | 0010 | 0000 | 0000 | 0000 | 0000 | 0000 | 0000 | 0000 | 0010 | 0 | 0 |
| 0001 | 0001 | 0001 | 0100 | 1100 | 1001 | 0001 | 0001 | 0000 | 0000 | 0000 | 0000 | 0000 | 0000 | 0000 | 0001 | 0 | 0 |

2. The method of claim 1, where encoding the check bits is performed with exclusive-or gates or exclusive-nor gates.

3. A method of correcting single 4-bit symbol errors and detecting double symbol errors in a 144-bit data stream being transmitted in a computer system using a (146,130) error correcting code, comprising the steps of:

d) decoding said syndrome to determine if any errors occurred in the data stream by producing error indicators; and e) correcting from 1 to 4 bits of a single symbol in the data stream or signaling that an uncorrectable error has occurred based on decoding said error indicators and said syndrome.

* * * * *